United States Patent [19]
Cheng

[11] Patent Number: 6,053,688
[45] Date of Patent: Apr. 25, 2000

[54] METHOD AND APPARATUS FOR LOADING AND UNLOADING WAFERS FROM A WAFER CARRIER

[76] Inventor: David Cheng, 711 Hibernia Ct., Sunnyvale, Calif. 94087

[21] Appl. No.: 08/920,210

[22] Filed: Aug. 25, 1997

[51] Int. Cl.⁷ .................................................. B65G 49/07
[52] U.S. Cl. ..................... 414/416; 414/217; 414/939; 414/937; 414/744.3; 414/225.01; 414/627; 414/941; 414/684.3; 432/239; 118/719; 29/705
[58] Field of Search ..................................... 414/416, 937, 414/940, 935, 939, 217, 609, 684.3, 841, 744.3, 627, 225.01; 118/719; 29/705, 700; 432/239

[56] References Cited

U.S. PATENT DOCUMENTS

| | | | |
|---|---|---|---|
| 4,204,155 | 5/1980 | Terry | 324/158 F |
| 4,665,360 | 5/1987 | Phillips | 324/158 F |
| 4,749,943 | 6/1988 | Black | 324/158 F |
| 4,755,746 | 7/1988 | Mallory et al. | 324/158 F |
| 4,755,747 | 7/1988 | Sato | 324/158 F |
| 4,775,281 | 10/1988 | Prentakis | 414/416 |
| 4,786,867 | 11/1988 | Yamatsu | 324/158 F |
| 4,818,169 | 4/1989 | Schram et al. | 414/331 |
| 4,907,931 | 3/1990 | Mallory et al. | 414/225 |
| 4,929,893 | 5/1990 | Sato et al. | 324/158 F |

(List continued on next page.)

OTHER PUBLICATIONS

International 300 mm Initiative, 13001 Guidelines on 300 mm Process Tool Mechanical Interfaces for Wafer Lot Delivery, Buffering, and Loading (Rev. D. Sep. 3, 1996) International 300 mm Initiative, Technology Transfer 97063298A–XFR.

300 mm Wafer Carrier & Interface Workshop Presentation Materials, Held Dec. 6, 1996, Makuhari Messe International Convention Hall Chiba, Japan, Distributed by SEMI, SEMI-CON Japan '96.

DOC 2472, Provisional Mechanical Specification for Boxes and Pods used to Transport and Store 330–mm Wafers, Semiconductor Equipment and Materials International, Mountain View, CA 94043, Doc. 2472 © SEMI.

JENOPTIK, Infab, 300mm Carrier and Loadports.

ERGOSPEED ™ 3000 Series, JENOPTIK Infab.

Integrated Systems for Iab Automation and Process Control, JENOPTIK Infab.

300 mm CAPSil™ Product Information, 1996 EMPAK, Inc. EMPAK.

300 mm CAPSil™.

I/O Port (fix position 900 mm), INFAB 300 mm Product Overview, Rev. 2, Sep. 1995. 15 pages.

300 mm Carriers, Load Ports, and Minienvironments, INFAB, 1834 E. Oltorf St., Austin, Texas 78741, INFAB OEMPKG Rev. 2. 1 Sep. 14, 1995.

CDE ResMap, Creative Design Engineering, Inc., 20565 Alves Dr., Cupertino, CA 95014 U.S.A.

CDE Creatie Design Engineering, Inc., ResMap 4 point probe Rs Mapping Tool, Jun. 1997, CDE ResMap Automatic Resistivity Mapping Tool.

*Primary Examiner*—Frank E. Werner
*Attorney, Agent, or Firm*—Hickman Stephens Coleman & Hughes, LLP

[57] ABSTRACT

A wafer handling apparatus and method includes a wafer carrier station for supporting a wafer carrier, such as an enclosed pod, that holds one or more wafers. A grounded interface panel is provided between the carrier station and a clean testing or processing environment. A z-movement mechanism moves the carrier station and the wafer carrier in a z-direction. A door opening mechanism removes a door from said carrier through a door opening in the interface panel. A handler mechanism includes a wafer holding device, such as a flat end effector, that moves into the wafer carrier at a separate access opening to load or unload a wafer to or from the wafer carrier. Wafer carriers holding different amounts of wafers can be used with no major structural changes to the apparatus.

24 Claims, 9 Drawing Sheets

U.S. PATENT DOCUMENTS

| | | | |
|---|---|---|---|
| 4,951,601 | 8/1990 | Maydan et al. | 414/937 X |
| 5,166,603 | 11/1992 | Hoshi | 324/158 P |
| 5,186,238 | 2/1993 | del Puerto et al. | 165/80.4 |
| 5,220,279 | 6/1993 | Nagasawa | 324/158 P |
| 5,377,476 | 1/1995 | Böhmer et al. | 414/937 X |
| 5,479,108 | 12/1995 | Cheng | 324/765 |
| 5,546,179 | 8/1996 | Cheng | 356/73 |
| 5,664,925 | 9/1997 | Muka et al. | 414/937 X |
| 5,697,749 | 12/1997 | Iwabuchi et al. | 414/937 X |
| 5,772,386 | 6/1998 | Mages et al. | 414/937 X |
| 5,810,537 | 9/1998 | Briner et al. | 414/937 X |
| 5,902,088 | 5/1999 | Fairbairn et al. | 414/937 X |

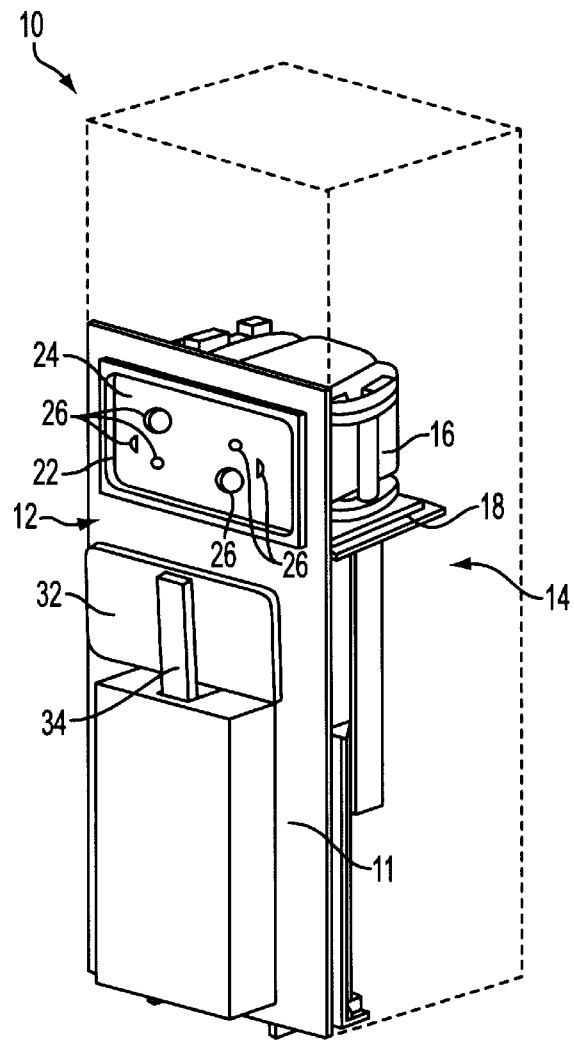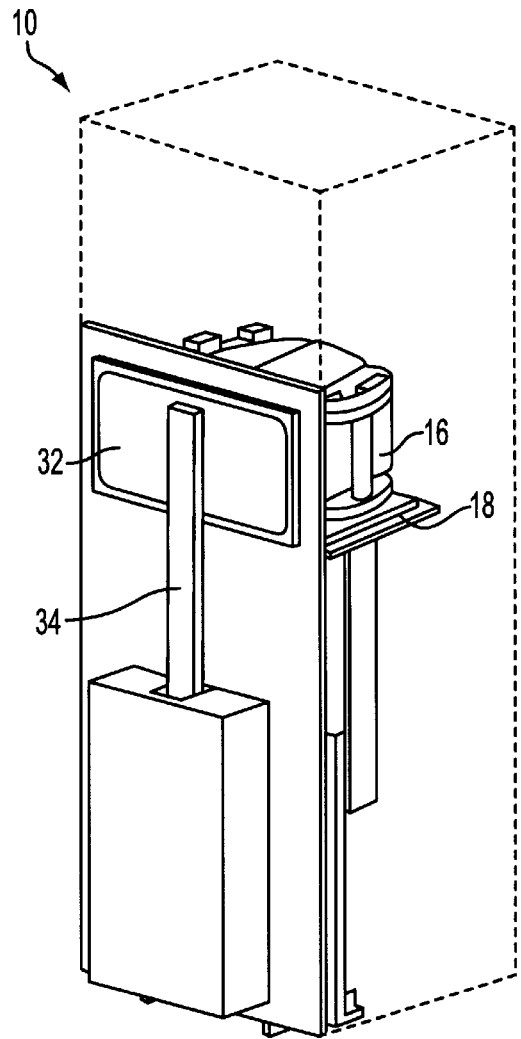
FIG. 1A
(PRIOR ART)
FIG. 1B
(PRIOR ART)

METHOD AND APPARATUS FOR LOADING AND UNLOADING WAFERS FROM A WAFER CARRIER

BACKGROUND OF THE INVENTION

1. Field of the Invention

This invention relates to the handling of wafers, and more particularly to the handling of wafers in a wafer testing and/or processing procedure and apparatus.

2. Background of the Related Art

The manufacture of integrated circuits (I.C.'s) begins with blank, unpatterned semiconductor wafers. These wafers undergo a number of sometimes critical process steps before being formed into the final I.C. form. A substandard wafer can affect the number of usable I.C.'s on a wafer (yield). It is therefore desirable to have a machine for testing wafers to ensure the wafers meet a customer's standards to maximize wafer yield.

The testing of wafers is often accomplished by an automated process, in which robots continuously handle and test the wafers. Robot testing and handling tends to be more efficient than manual testing and handling of wafers, since robots can be much faster, more precise, and less contaminating than human operators when handling wafers. In wafer handling processes, wafers are typically transported using carriers such as wafer cassettes and wafer pods. Pods differ from cassettes in that the pods typically are sealed to prevent contamination to the wafers enclosed therein.

Previously, wafers having a diameter of 8 inches were commonly used in the semiconductor industry for the manufacture of I.C.'s. More recently, 300 mm or 12-inch diameter wafers have been introduced to allow a greater number of integrated circuits to be produced from one wafer, thus lowering the cost of producing the I.C.'s. New equipment and procedures have been developed to handle and process these new, larger wafers. For example, new larger, standard wafer pods, or Front Opening Unified Pods (FOUPs) have been developed. These sealed pods provide a contamination-free storage environment for the wafers. To unload the wafers, the FOUP is positioned so that the wafers are oriented horizontally, the front door of the FOUP is opened to a contamination-free environment inside the testing equipment and a robot end-effector is used to remove a wafer for processing or testing. Other versions of pods are used for smaller sized wafers; for example, Standard Mechanical Interface (SMIF) pods are typically used for 5-inch, 6-inch, and 8-inch wafers.

One tool for use with contamination-free handling of wafers is a load port. These tools allow a wafer carrier or pod to dock to a handling tool while providing a continuous, clean environment for wafers as they are unloaded from the FOUP by the end-effector mechanism. One typical example of a prior art load port is illustrated in FIGS. 1a–1c. In FIG. 1a, load port mechanism 10 includes a panel 11 having an equipment side 12 and a FOUP side 14. On the FOUP side 14 of panel 11, a FOUP 16 is positioned on an unloading station 18 and includes one or more wafers. In some embodiments of load port mechanisms, additionals FOUPs can be loaded in the mechanism 10 and can each be moved into the unloading position once the wafers of FOUP 16 have been unloaded, processed and/or tested.

On the equipment side 12 of panel 11, the load port mechanism 10 includes a opening 22 in panel 11 which is approximately the same dimensions as a front door 24 of the FOUP 16. The front door 24 is aligned with the opening 22, where contamination is prevented from entering the clean environment by exerting positive air pressure inside the clean environment. Front door 24 includes several fastening mechanisms 26, such as registration pins, latch keys, vacuum fasteners, and, optionally, purge ports for the introduction/withdrawal of gasses from the FOUP 16.

Load port mechanism 10 also includes a door removing mechanism 30, which includes a plate 32 and a support rod 34. The plate 32 and rod 34 are shown in a lowered position in FIG. 1a. FIG. 1b illustrates the load port mechanism 10 of FIG. 1a in which the door removing mechanism 30 has been moved into a position to remove the front door 24 of the FOUP 16. Plate 32 has been raised by support rod 34 by motors or other mechanism to the level of door 24 and opening 22. The plate 32 and rod 34 are then moved toward the opening 22 and plate 32 is inserted into the opening to engage the door 24. Preferably, plate 32 includes components that mate with the fastening mechanisms 26 on the front door; e.g., plate 32 can include apertures into which pins on door 24 fit, latch keys to unlock a latch securing the door, etc. In some embodiments, vacuum pressure can be used to assist the plate 32 in mating with door 24.

FIG. 1c illustrates the prior art load port mechanism 10 after door removing mechanism 30 has removed the front door 24 from the FOUP 16. The plate 32 and rod 34 is moved back three or more inches from the inserted position of FIG. 1b, where the door 24 is attached to plate 32. The plate and door are then lowered to the position shown in FIG. 1c. Since the wafers in FOUP 16 now are accessible through opening 22, a robot having z-axis movement such as handler arm 34 and end-effector 36 can be used to remove one or more wafers, one at a time, and transport the wafers to another testing or processing station. The FOUP 16 remains stationary as the robot is moved to different elevations to take out the wafers. The robot loads the wafers into the FOUP in the same way that the wafers are unloaded after the wafers have been tested and/or processed. In some embodiments, a can be lowered to the unloading position once the wafers of FOUP 16 are tested or processed.

While the prior art wafer handling and test systems have been successful in handling and testing wafers, they tend to exhibit some undesirable characteristics. One problem with the load port mechanism as illustrated in FIGS. 1a–1c is that the mechanism is dedicated to one size of FOUP. For example, 300 mm wafer FOUPs are typically provided as two standard sizes: a smaller size that holds 13 wafers and a larger size that holds 25 wafers. The opening 22 of the prior art load port mechanism has a single size intended to fit one side of FOUP door; thus, to fit a different sized FOUP door, the frame having opening 22 must be changed to a different frame having the desired size of opening, and plate 32 must be changed to one having the appropriate size. Making these complex mechanical changes can take hours, and the contaminant-free air of the processing environment must be broken, requiring the environment to be cleaned again after the change is made.

Another problem with the prior art load port mechanism is that the cost of the mechanism can be excessive. A robot mechanism is required to unload the wafers from the FOUP, and the robot must have several degrees of freedom to access the wafers of the FOUP, including a fairly large z-axis movement. This requires a more complex and costly type of robot that requires more maintenance, which is undesirable in production environments. In addition, the load port mechanism of the prior art must elevate a plate 32 by ten or more inches and then move the plate toward the door of the FOUP by a distance of three or more inches. A mechanism providing such movement is more expensive than simpler mechanisms having less degrees of freedom and moving the components a shorter distance.

SUMMARY OF INVENTION

The present invention addresses the problems in the prior art by providing a method and apparatus for loading and unloading wafers from a wafer carrier such as enclosed pod in a more efficient way. The door is opened through one opening in an interface panel while wafers are loaded and unloaded through a different opening, allowing the door opening mechanism to be simpler and less costly.

More specifically, a wafer handling apparatus of the present invention includes a carrier station for supporting a wafer carrier that holds one or more wafers. A grounded interface panel is provided between the carrier station and a clean testing or processing environment. A z-movement mechanism moves the carrier station and the wafer carrier in a z-direction. A door opening mechanism removes a door from said carrier through an opening in the interface panel. A handler mechanism includes a wafer holding device that moves into the wafer carrier at a location different from said opening, preferably at a separate access opening, to load or unload a wafer to or from the carrier.

Preferably, the carrier includes an enclosed pod for holding the wafers and sealing the wafers from the surrounding environment, such as a Front Opening Unified Pod (FOUP). The wafer holding device can be a flat end effector for supporting a wafer. The end effector may be constrained to move only in an x-y plane, or move only in the x-direction, and not in the z-direction. The door opening mechanism may include a planar member or plate that translates to engage the door of the wafer carrier and pull the door from said carrier through the main opening in the panel; the planar member need only move within a small workspace, such as one inch. The planar member includes structures to engage pins in the door. Differently-sized wafer carriers can be positioned at the carrier station; for example, two standard sizes include one pod that holds a maximum of 13 wafers and another pod that holds a maximum of 25 wafers. The door removal mechanism may remove (or replace) a door from a carrier of any of these sizes without requiring that the main opening in the interface panel be replaced to accomodate the size. Preferably, the opening is large enough to allow a door of the largest carrier to move therethrough, and a spacer plate is used to block any unused portion of the opening. Wafer carriers of smaller size, in the preferred embodiment, may be moved on the z-axis and are centered at the opening. A controller such as a digital computer coordinates the movement of the mechanisms of the apparatus.

A method of the present invention for moving a wafer relative to a wafer carrier includes moving the wafer carrier in a z-direction until an opening in a grounded interface panel is aligned with a door of the wafer carrier. A door opening mechanism is moved through the opening to engage the door and remove the door from the wafer carrier. The wafer carrier is again moved in a z-direction until a desired wafer in the wafer carrier is aligned with an access aperture in said panel that is being separate from said opening. A wafer handling mechanism, preferably including a flat end effector, is then moved through the access aperture and into the carrier to pick up and remove the desired wafer. Preferably, the wafer handling mechanism is moved only within an x-y plane and is not moved in a z-direction. Once the wafer handling mechanism is moved into the carrier, the wafer carrier is moved in a downward z-direction to leave the desired wafer resting on the wafer handling mechanism so it may be moved. The wafer carrier is moved in a z-direction to align other wafers in the carrier to be unloaded. A similar method can be used to load a wafer to the wafer carrier.

The present invention provides a simpler, less costly mechanism for loading and unloading wafers from a wafer carrier such as a pod. The door removing mechanism and wafer handling mechanism access the pod at different locations on the interface panel, where a z-axis mechanism moves the pod to the desired opening location. The door mechanism thus need only pull back the door a small distance and the wafer handler need only be moved in a plane to access the wafers, since the z-axis movement is provided for the wafer pod rather than separately on both the wafer handler and the door mechanism. In addition, the ability to handle differently-sized wafer carriers without having to mechanically change parts and break the clean environment saves time and expense.

These and other advantages of the present invention will become apparent to those skilled in the art after reading the following descriptions and studying the various figures of the drawings.

BRIEF DESCRIPTION OF THE DRAWINGS

FIGS. 1a, 1b, and 1c are perspective views of a prior art load port mechanism;

FIG. 3a is top plan view of the mechanism of FIG. 2a;

FIG. 4b is a perspective view of the wafer carrier station of the mechanism of FIG. 4a.

DETAILED DESCRIPTION OF THE PREFERRED EMBODIMENTS

Figure 1C:
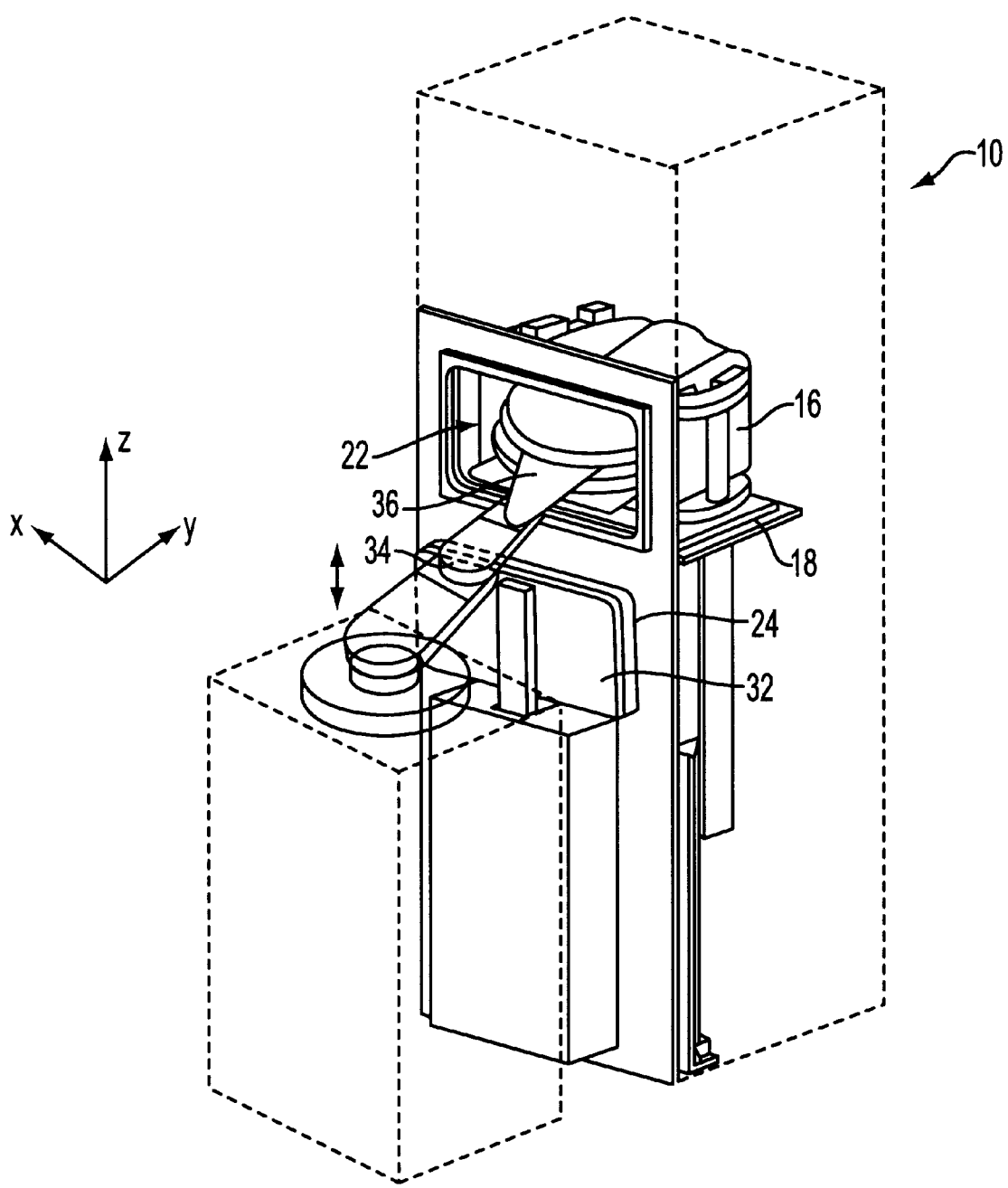
Figure 2A:
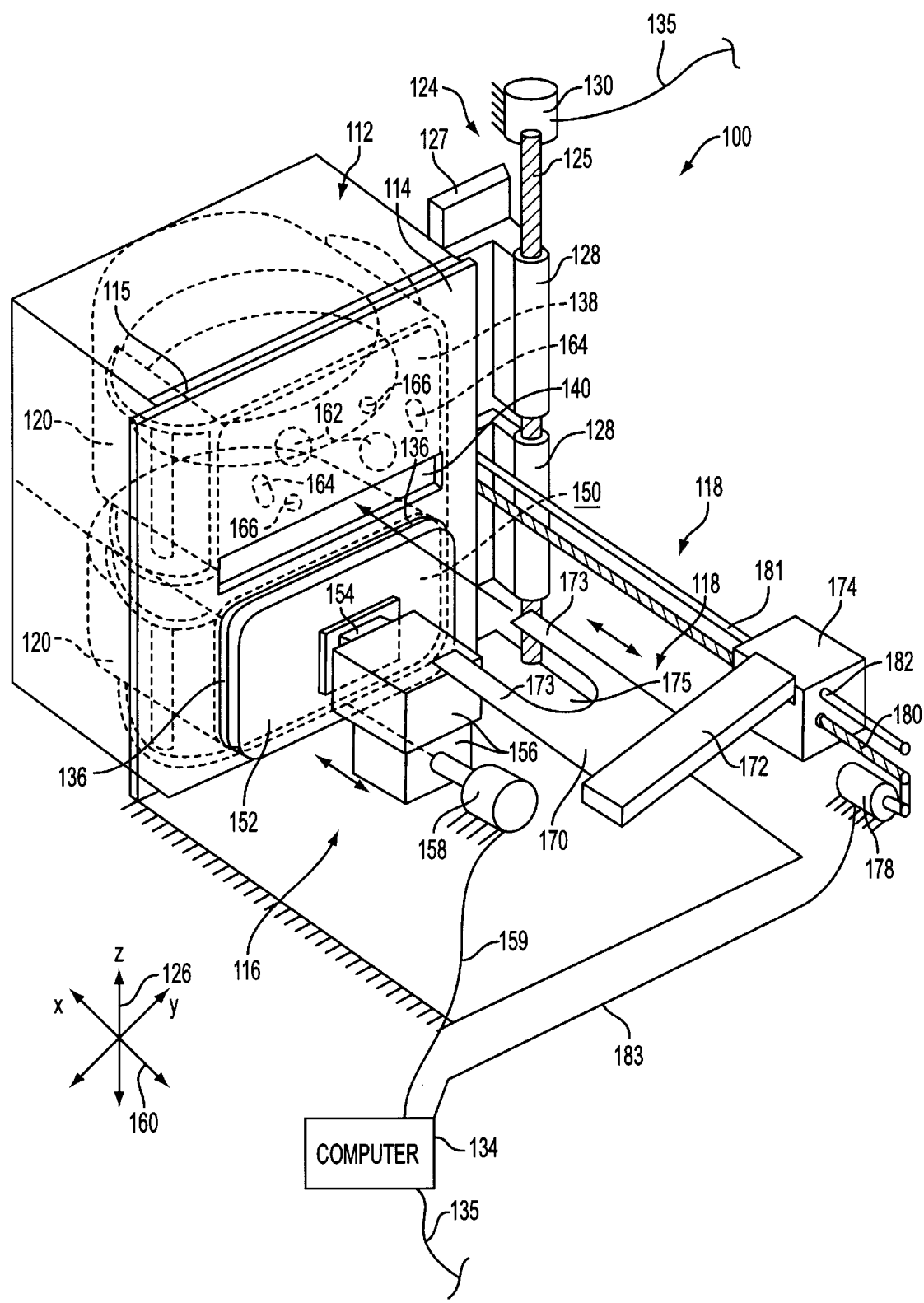
FIG. 2a is a perspective view of a wafer loading and unloading mechanism of the present invention.

FIG. 2a illustrates a wafer loading and unloading apparatus 100 of the present invention. Apparatus 100 includes a wafer carrier holding station 112, an interface panel 114, a door opening mechanism 116, and a wafer handler mechanism 118.

Wafer carrier holding station 112 is used to position wafer carriers in the desired position so that wafers enclosed by the carriers can be unloaded to be processed and/or tested by appropriate equipment. The holding station 112 is provided on one side of interface panel 114 which is in an environment that may have a greater contamination level than required for the testing and or processing of wafers, i.e. the station 112 is located on the exterior of the environment in which processing and testing of wafers is to be accomplished.

Thus, wafers that are transported through this exterior environment, if desired to remain substantially contamination free, are enclosed in sealed wafer carriers that protect the wafers from the environment. Enclosed, sealed wafer carriers are also known as wafer "pods", as distinguished from wafer cassettes which may be open to the surrounding environment. A type of pod particularly suitable for use with the present invention is a Front Opening Unified Pod (FOUP), which is an industry standard pod that includes a door designed to be opened from the front of the carrier rather than the bottom of the carrier as in other types of pods. The pod holds wafers in slots of the pod, and is typically provided in multiple sizes, e.g., a large sized pod holds a maximum of 25 wafers and a smaller pod holds a maximum of 13 wafers. Other types of wafer carriers, such as wafer cassettes, may also be used in the present invention.

Holding station 112 includes a floor, may include vertical walls, and holds a pod 120 supported by the station floor. Station 112 may hold other types of wafer carriers in other embodiments. Pod 120 is shown at a lower position of station 112 at the load port of the apparatus 100 where a door of the pod is attached and removed to and from the pod. The lower unloading/loading position may be changed in height as desired to accomodate a handling robot's interfacing requirements. In FIG. 2a, pod 120 is also shown at an upper position in station 112 at which a wafer is removed from the pod. Although, in the described embodiment, only one pod is intended to be positioned in station 112 at one time, in alternate embodiments, additional pods may also be loaded at the holding station 112. For example, an additional pod might be stacked on top of pod 120 and moved into the load port position using the z-axis mechanism of the holding station 112, as described below.

Holding station 112 includes a moving panel 115 which is positioned against interface panel 114. Preferably, the pod 120 is inserted into station 112 such that the front face/door of the pod is contacting panel 115. This minimizes any contamination entering the testing and processing environment. Panel 115 includes an opening (not shown) which is about the same size as main opening 136 in panel 114, and is large enough to allow the door of the pod to be moved through it. In addition, positive air pressure is provided in the processing/testing environment such that air flows out of the environment through any leaks in the apparatus 100 and contaminants do not flow inside.

Holding station 112 includes a z-axis mechanism 124 which operates to move the station 112 along the z-axis 126. The z-axis mechanism can be implemented as any suitable mechanism for elevating the station 112 and pod 120. For example, in one embodiment, lead screw 125 can be provided in threaded braces 128 coupled to sides of station 112 and rotatably driven by a grounded motor 130 (if multiple screws 125 are provided, a motor can be provided for each screw in some embodiments). When the screw 125 is rotated, the station 112 moves up or down along the lengths of the screw. Guide rails such as guide 127 can be provided on edges or sides of station 112 to guide the station. Motor 130 is preferably controlled by a connected computer 134 through a bus 135 which can control the motor 130 to rotate in either direction and thus move the station in either direction on the z-axis. For example, motor 130 can be a stepper motor or position servo motor, and computer 134 can rotate the stepper motors in precise steps, allowing the station 112 to move along the z-axis in small, precisely-defined increments. The z-movement of station 112 is described in greater detail with respect to FIGS. 3a–3f.

In other embodiments, other mechanisms can be used for z-axis mechanism 124, such as cables and pulleys, gears, etc. In yet other embodiments, the station 112 can be moved in other directions instead of along the z-axis, such as on the x-axis or the y-axis.

Interface panel 114 is a stationary, grounded panel provided as a wall to the enclosed clean environment 150 in which the processing and testing of wafers is accomplished. Panel 114 includes a main opening 136 which is the load port through which the door 138 is moved. Preferably, the panel 115 of the station 112 is as closely spaced to the surface of the panel 114 as practical to allow z-movement, e.g. 1 mm of space can be provided between panels 114 and 115. Opening 136 is provided to allow the door opening mechanism to open door 138 of pod 120, as described in greater detail below.

Interface panel 114 also includes a wafer access opening 140 which in the described embodiment is positioned above the main opening 136. Access opening 140 is provided to allow a portion of wafer handling mechanism 118 to pass through interface panel 114 and into pod 120 to unload or load a wafer from the carrier. This is described in greater detail below. Preferably, panel 115 blocks opening 140 when the pod is at the lower position to prevent contaminants from flowing in through access opening.

Clean environment 150 is provided on one side of interface panel 114 and may include various semiconductor processing and testing equipment for use with wafers or other workpieces. Since this environment 150 is typically desired to be substantially contaminant-free, various mechanisms and structures are used to remove contaminants from the environment and filter incoming air of contaminants. For example, a blower and filter (shown in FIG. 3b) are preferably included in environment 150 for providing a desired pressure and for removing contaminants in environment 150.

Door opening mechanism 116 is positioned in clean environment 150 and is used to remove the door 138 of pod 120 to allow access to the wafers stored in the pod. Mechanism 116 includes an engagement plate 152, and extending support 154, a grounded portion 156, and an actuator 158. Engagement plate 152 translates along the x-axis 160 as supported by support 154, which is coupled through grounded portion 156 to actuator 158. Actuator 158 is coupled to computer 134 by bus 159 and is controlled to move the engagement plate 152 in either direction along the x-axis 160. The plate 152 is moved through opening 136 in interface panel 114 to engage the door 138 of pod 120. When plate 152 is moved back in the direction away from pod 120, the door 138 is pulled back with the plate, thus exposing the wafers inside. Since the plate 152 need not be moved precisely along the x-axis and need only be positioned at the end points of its range of travel, actuator 158 can be a pneumatic piston actuator or other simple device, or alternatively, a motor. In other embodiments, the engagement plate can move in other directions depending on the position of door 138. In yet other embodiments, other mechanisms can be used to move plate 152.

Plate 152 includes a number of apertures, pins, vacuum pads, and/or other engagement and unlocking mechanisms which are used to engage the door 138. Typically, the doors 138 of pods such as FOUPs or other wafer carriers are standardized with pins, ports, and latch mechanisms provided in a particular configuration. For example, door 138 of pod 120 in an upper position of station 112 is shown including registration pins 162 provided in apertures in door 138 which mate with corresponding holes and slots on plate 152. Door 138 may also include latch keys 164 which may be rotated to unlock the door and allow it to be removed. Plate 152 may include rotating sockets which fit the latch keys and rotate them to unlock door 138. Vacuum pads may be included on door 138 to receive pins that apply vacuum pressure through openings to help secure the door to the plate 152. In addition, door 138 of a pod may include purge ports 166 which may be used to pump inert gases into and out of the pod; plate 152 may include appropriate hoses and connections to a pump or source of gas for such an operation, as is well known to those skilled in the art.

Wafer handling mechanism 118 is used to unload or load a wafer or other workpiece from a wafer carrier such as pod 120. In the described embodiment, the mechanism 118 preferably includes a pick or "end effector" 170, a support arm 172, a carriage 174, a guide 176, and a motor 178. End effector 170 is a flat, spatula-like implement used to support a wafer from underneath the wafer and move the wafer to a desired location. The end effector 170 in some embodiments may be shaped to have two prongs 173 separated by space 175. This allows a chuck or other supporting surface to be moved in a z-direction between prongs 173 and raise a wafer off the end effector 170. The end effector can be shaped differently in other embodiments, such as a wand, plate, etc. In some embodiments, the end effector can include apertures that are coupled to a vacuum pump to cause a suction force that securely holds a wafer to the end effector, as is well-known to those skilled in the art.

End effector 170 is moved along the x-axis 160, through access opening 140 in interface panel 114, and into pod 120 to retrieve a wafer. The z-axis mechanism 124 is used to lower a wafer onto the end effector 170 as described in greater detail below. Once end effector 170 holds a wafer, the end effector is moved out from the pod 120 along the x-axis until it is positioned above or in a testing or processing chuck or chamber (not shown). To allow this movement, the end effector is coupled to moveable carriage 174 by support 172. Carriage 174 is coupled to a lead screw 180 which is routed through a threaded bore 182 in carriage 174. The central axis of lead screw 180 is positioned approximately horizontally parallel to x-axis 160. A grounded guide shaft 181 is also provided parallel to lead screw 180 and through an aperture in carriage 174 to guide the carriage parallel to the x-axis 160 (a rail or slide mechanism can also be used). Motor 178 is coupled to lead screw 180 and is operative to rotate the lead screw such that carriage 174 moves along the lead screw 180 and guide 181 as it is rotated. Motor 178 is coupled to computer 154 by a bus 183 and is precisely controlled by computer 134 to rotate in either direction on the x-axis to cause end effector 170 to moved in either direction on the x-axis. Motor 178, for example, can be a stepper motor or a position servo motor. In alternate embodiments, other types of mechanisms can be used to move end effector along an axis. For example, the carriage 174 can be driven along a rod by motor gears, a hydraulic system, or pulley system.

In the preferred embodiment, end effector 170 is constrained to move only along the x-axis, since end effector movement along the other axes is not necessary in the preferred embodiment and needlessly complicates the end effector mechanism. However, in other embodiments, the end effector can be set up to move in both the x-axis and y-axis directions to, for example, move the wafer to desired testing or processing stations. In one such embodiment, the lead screw 180 and guide 181 are able to move in a y-axis direction by the use of tracks or guides positioned perpendicularly to the lead screw and guide.

Computer 134 controls the movement of the components of the apparatus 100 as explained above. Computer 134 can be any suitable controller device, such as an IBM-compatible personal computer based on a Pentium class or other microprocessor, Macintosh computer, workstation, or other computing device.

Figure 2B:
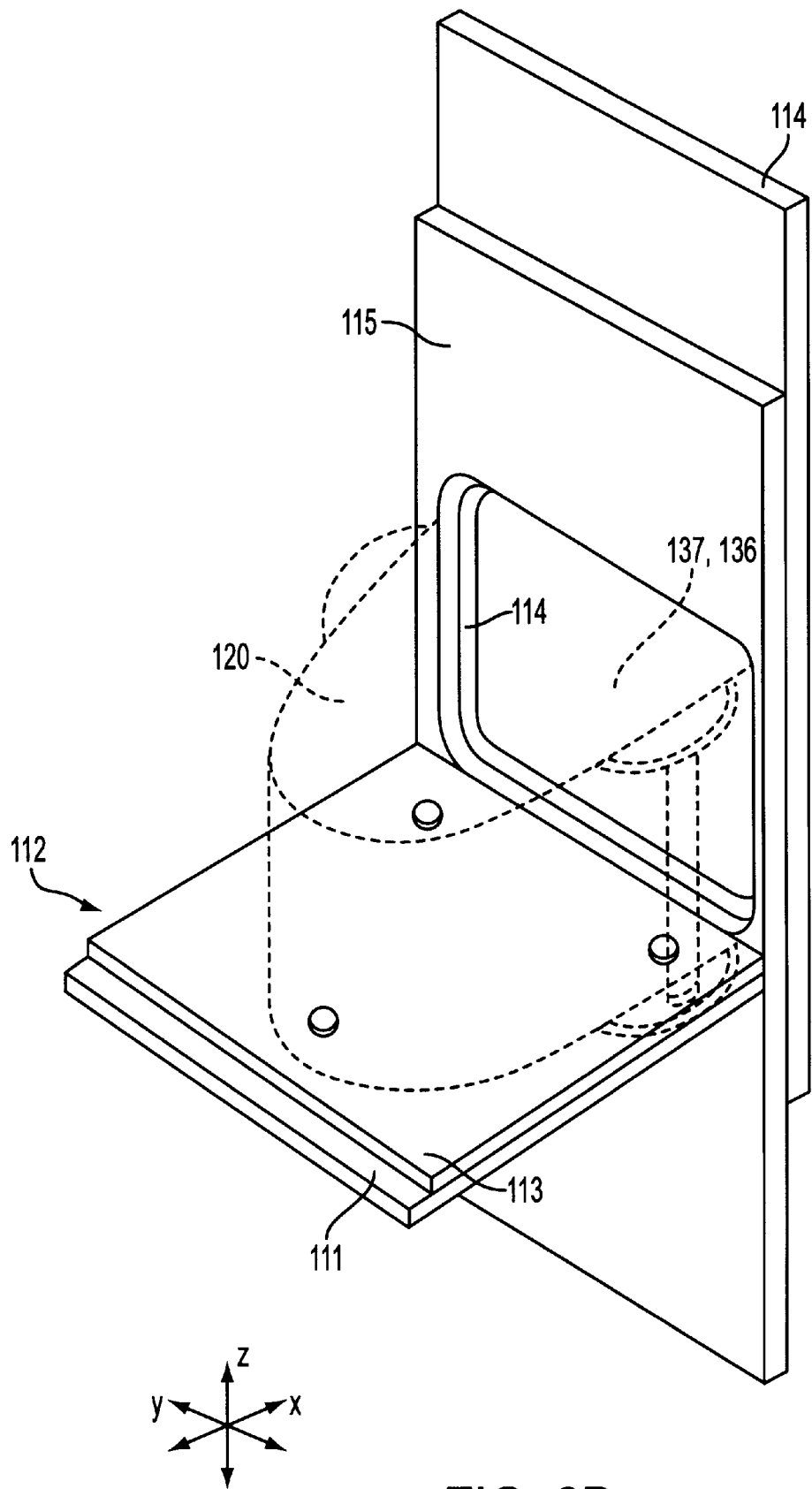
FIG. 2b is a perspective view of the carrier holding station of the present invention.

FIG. 2b is a perspective view of the wafer holding station 112 of the apparatus 100 of FIG. 2a. Station 112 includes a base plate 111 and a pod plate 113 (plates 111 and 113 can be integrated as a single plate if desired). Base plate 111 is coupled to panel 115 and is driven by the z-axis mechanism 124 to move along the z-axis. Pod plate 113 is coupled to the base plate 111 and includes pins 109 to allow coupling a pod to the plate 113. Pins 109 are preferably in a standard configuration for pods, and allow a pod 120 to be first placed on the plate 113 and then pushed toward panel 115, through an opening 137 in panel 115, and locked into place such that the front edge of the pod is flush with the other side of panel 115. When plates 111 and 113 and panel 115 are moved on the z-axis, opening 137 is aligned with opening 136 in panel 114 to allow the door to be removed or attached to the pod 120, as described below. In alternate embodiments, the pod 120 may be coupled to plate 113 such that the front of the pod is contacting panel 115 on the pod side of panel 115, so that door opening mechanism 116 reaches through both opening 136 and 137 to contact the door 138 of the pod.

After a pod 120 is coupled to base plate 111 and secured in opening 137 of panel 115, the wafers may be removed and processed as described below (the clean environment 150 can have been previously cleaned).

Figure 3A:
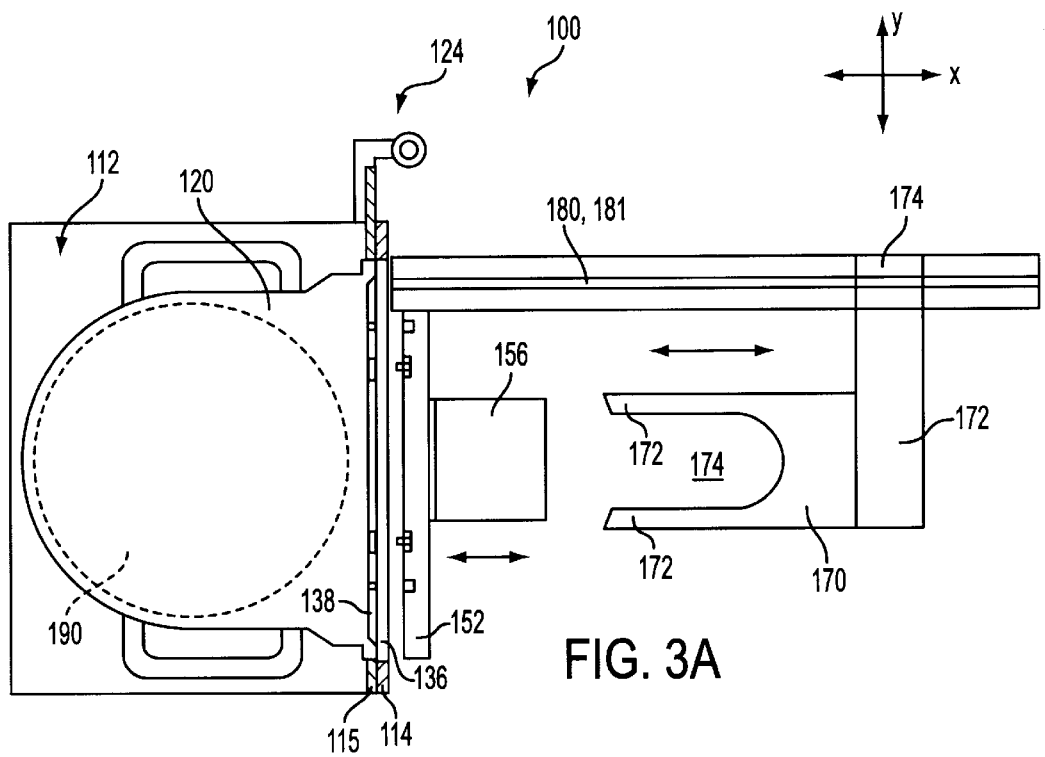

FIG. 3a is a top plan view of the wafer loading/unloading apparatus 100 of FIG. 2a. A number of wafers 190 are provided in pod 120. End effector 170 is preferably aligned with the center of the wafers along the y-axis so as to pick up the wafers with greater stability. Engagement plate 152 is shown fully retracted from the interface panel 114 and the door 138 to pod 120. At its most fully retracted position, plate 152 need only be about 1 inch or so from the surface of the door 138 of the pod, i.e. the plate needs only about a 1 inch range of movement on the x-axis. The various motions of the engagement plate 152 and end effector are shown with arrows.

Figure 3B:
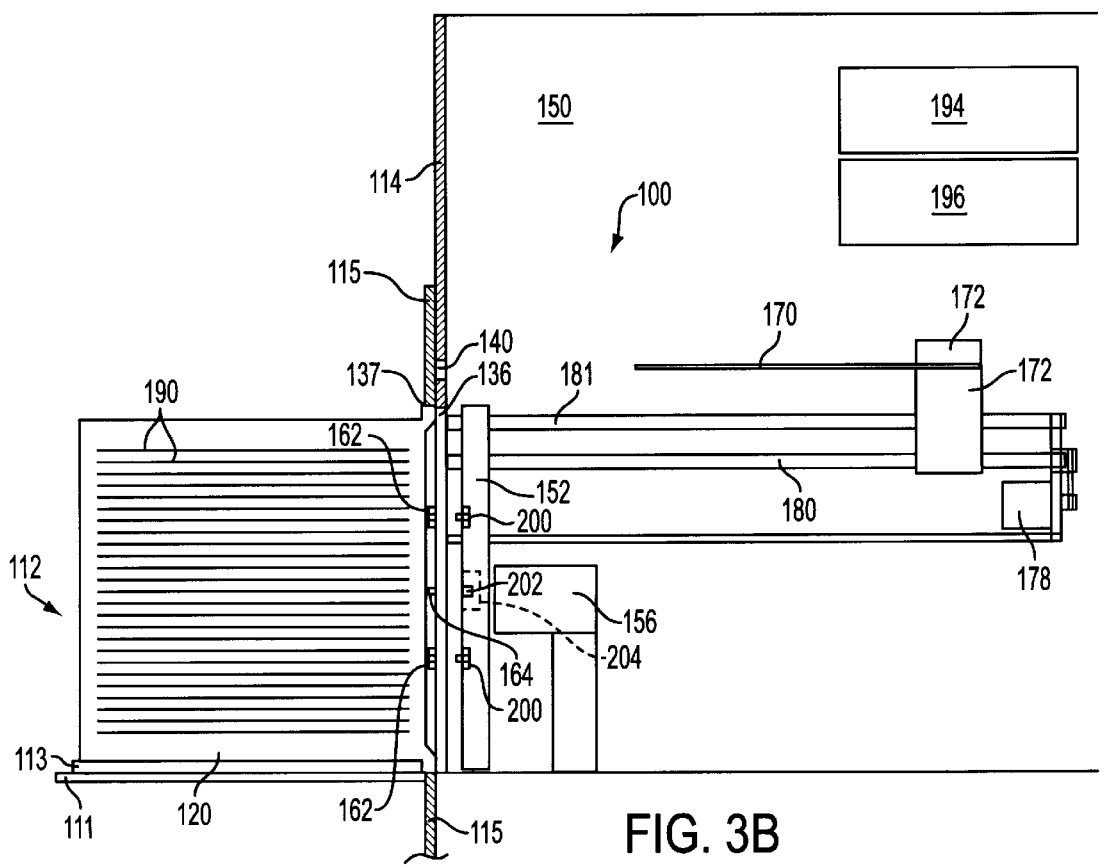
FIG. 3b is side elevational view of the mechanism of FIG. 2a in which a wafer pod has been placed.

FIG. 3b is a side elevational view of the apparatus 100 of FIG. 2a and 3a. Appratus 100 is preferably provided near a blower 194 and a filter 196. The blower continually forces air into the clean environment 150 to maintain a desired positive pressure in the environment to force out contaminants and prevent contaminants from entering the environment. Filter 196 removes particulate contamination from air forced into the environment 150. For example, filter 196 can include a ULPA filter or a HEPA filter, as is well known to those skilled in the art.

Pod 120 is in the door removal position of apparatus 100, where engagement plate 152 may remove the door 138 to the pod 120. Thus, the wafers 192 in pod 120 may be tested and/or processed once the door is removed and the wafers transported to the proper equipment. Engagement plate 152 includes pins 200 which engage registration pins 162 of door 138. Plate 152 also includes latch key recesses 202 for receiving the latch keys 164 of the door 138. In some embodiments, engagement plate 152 may be included with a pump, line, and other required equipment to support pumping of gases through ports on door 138.

Moving panel 152 includes opening 137 through which the front of pod 120 is positioned. A small gap, such as about 1 mm, may be present between the moving panel 115 and the interface panel 114. However, this gap is not large enough to let contaminants into environment 150 since the blower 194 provides a positive air pressure in the environment, thus forcing out and keeping out any contaminants. Panel 115 preferably extends above pod 120 and covers access opening 140, thus preventing contamination of the clean environment through the opening 140. In addition, panel 115 can extend below the base 111 to cover main opening 136 when the pod is elevated, as described below.

Figure 3C:
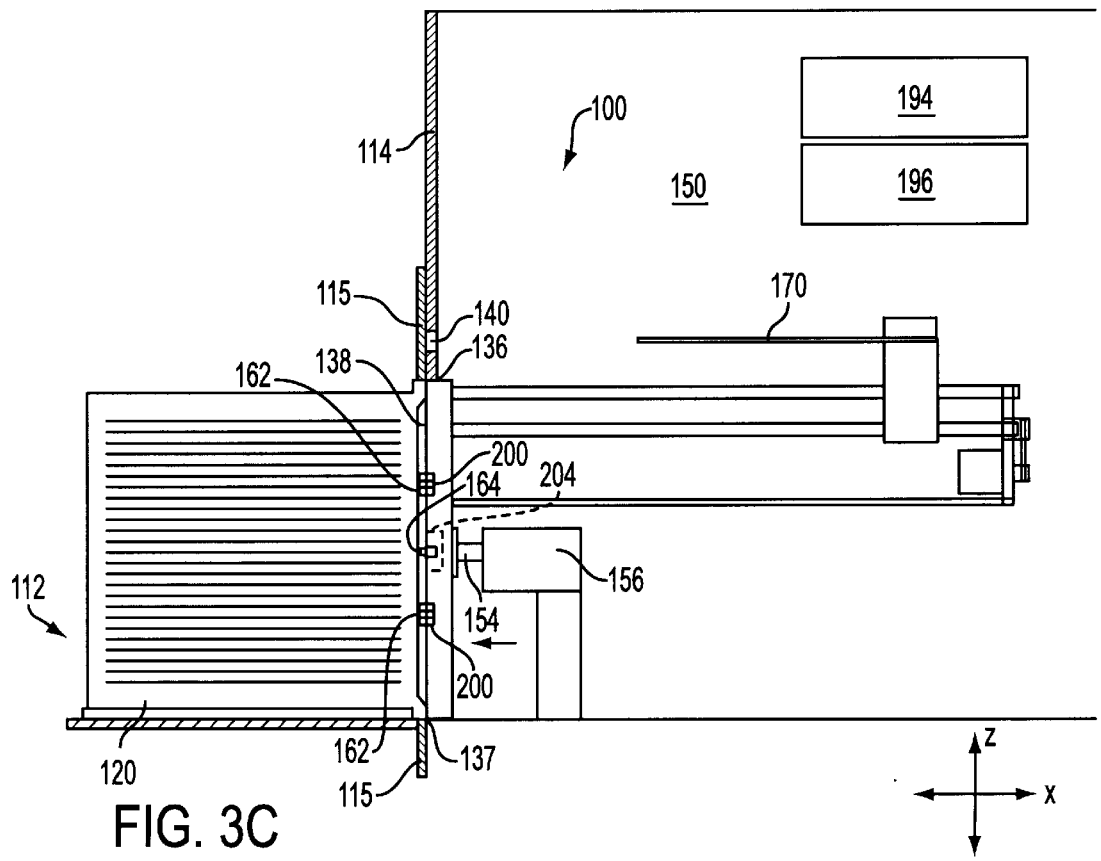
FIG. 3c is side elevational view of the mechanism of FIG. 2a in which a door opening mechanism has engaged the door of the pod.

FIG. 3c is a side elevational view of apparatus 100 in which engagement plate 152 has been moved into an engagement position with door 138. Computer 134 controls actuator 158 to move support 154 and engagement plate 152 along the x-axis from grounded base portion 156 toward interface panel 114. The engagement plate 152 moves through main opening 136 in interface panel 114, and the pins 200 engage the registration pins 162 on door 138. In addition, the latch key 164 on door 138 mates with recess 202, and the recess is rotated using a motor 204 provided in plate 152 (the motor is preferably controlled by computer 134). A motor 204 is provided for each latch key 164 included on door 138. This unlocks the door 138 from the pod and allows the door to be removed. Finally, a vacuum suction force may be used to engage the plate 152 with the door 138. For example, suction cups having an air suction provided through a hose to a pump can be provided around the pins that mate with registration pins 162 on door 138. Such techniques are well known to those skilled in the art. In the preferred embodiment, plate 152 need only have a movement range of 1 inch or so along the x-axis to move from a fully retracted position to the engaged position. In an alternate embodiment, pod 120 can be positioned against the pod-side surface of moving panel 115 so that plate 152 passes through opening 136 and opening 137 to contact the door 138; for example, the engagement mechanisms on the plate 152 can extend further to reach the door 138 through opening 137.

Figure 3D:
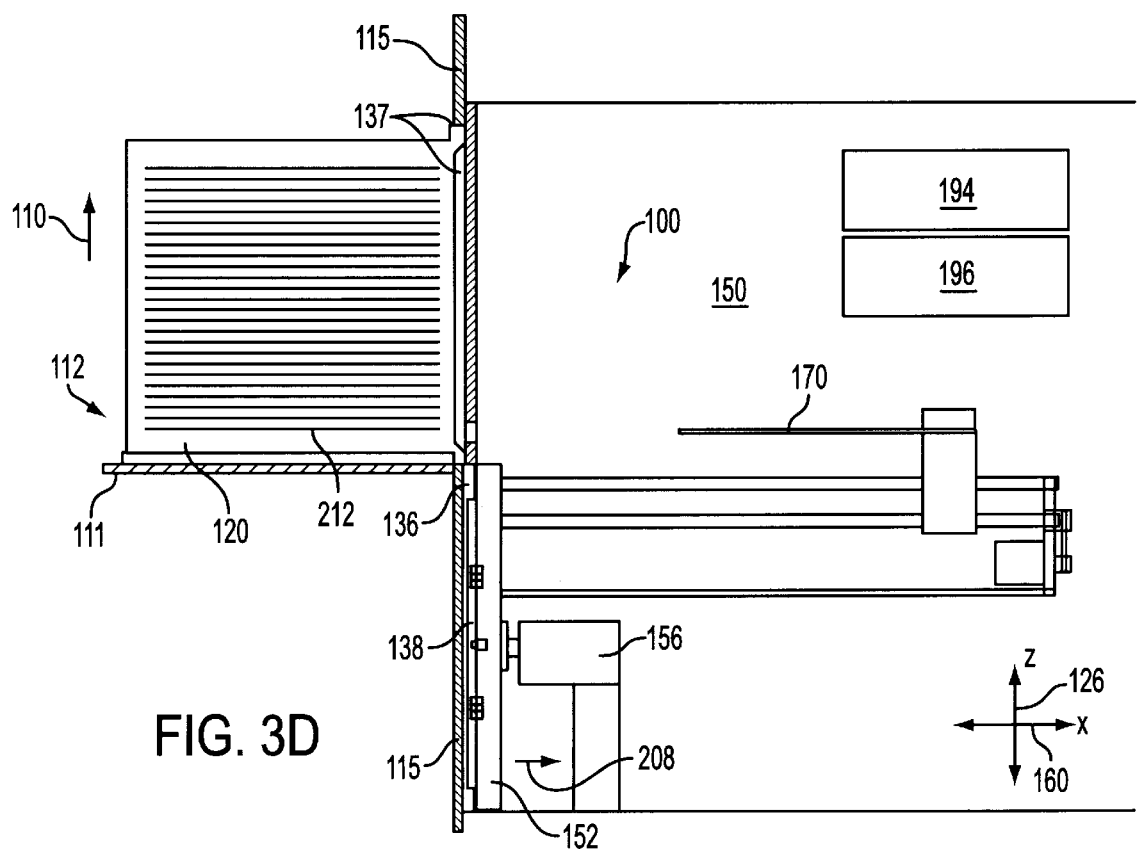
FIG. 3d is side elevational view of the mechanism of FIG. 2a in which the door of the pod has been removed and the pod has been moved to a wafer unloading position.

FIG. 3d is a side elevational view of apparatus 100 in which engagement plate 152 has been moved away from door 138 to its fully retracted position. Door 138 of pod 120 is engaged with plate 152 and is moved with the plate away from pod 120 as shown by arrow 208. The door 138 need not be moved very far away from the pod 120 and panel 115 to allow the pod and panel to be moved along the z-axis; this is one of the advantages of the present invention over the prior art. In addition, the door 138 and/or engagement plate 152 can block the opening 136 to maintain the clean environment 136.

Also shown in FIG. 3d is the wafer carrier station 112, pod 120, and panel 115 being moved on the z-axis in a direction indicated by arrow 210. The station and pod are moved in this direction until a wafer to be unloaded is aligned at a predetermined point on the z-axis 126 with respect to the end effector 170. For example, in pods and other carriers, the bottommost wafer 212 is typically the wafer that is first tested and/or processed, followed by each wafer positioned in the next higher slot of the pod. Thus, since the bottommost wafer 212 is to be processed in FIG. 3d, the pod 120 is raised to a position on the z-axis where wafer 212 is aligned with the access slot 140 in interface panel 114. Computer 134 controls the z-axis mechanism and stops the pod at the position shown in FIG. 3d. In some embodiments, panel 115 extends down beneath the base plate 111 of station 112 to cover the opening 136 in panel 114 while pod 120 is at the unloading/loading position to prevent contamination of the clean environment 150. In other embodiments, panel 115 need not extend down to cover opening 136 because door 138 or plate 152 is positioned to at least partially block opening 136 while at the retracted position of mechanism 116 (as shown in FIG. 3d). Thus, the positive air pressure in environment 150 is sufficient to prevent any contaminants from entering the environment 150 through any small leaks between the door 138 and the panel 114.

In alternate embodiments, the pod 120 can be moved in other directions to align wafers with an access opening. Also, the described apparatus having two panels 114 and 115 can be implemented in other ways to allow door opening mechanism 116 to remove/replace a door at one location and end effector 170 to remove a wafer from the pod at a different location.

Figure 3E:
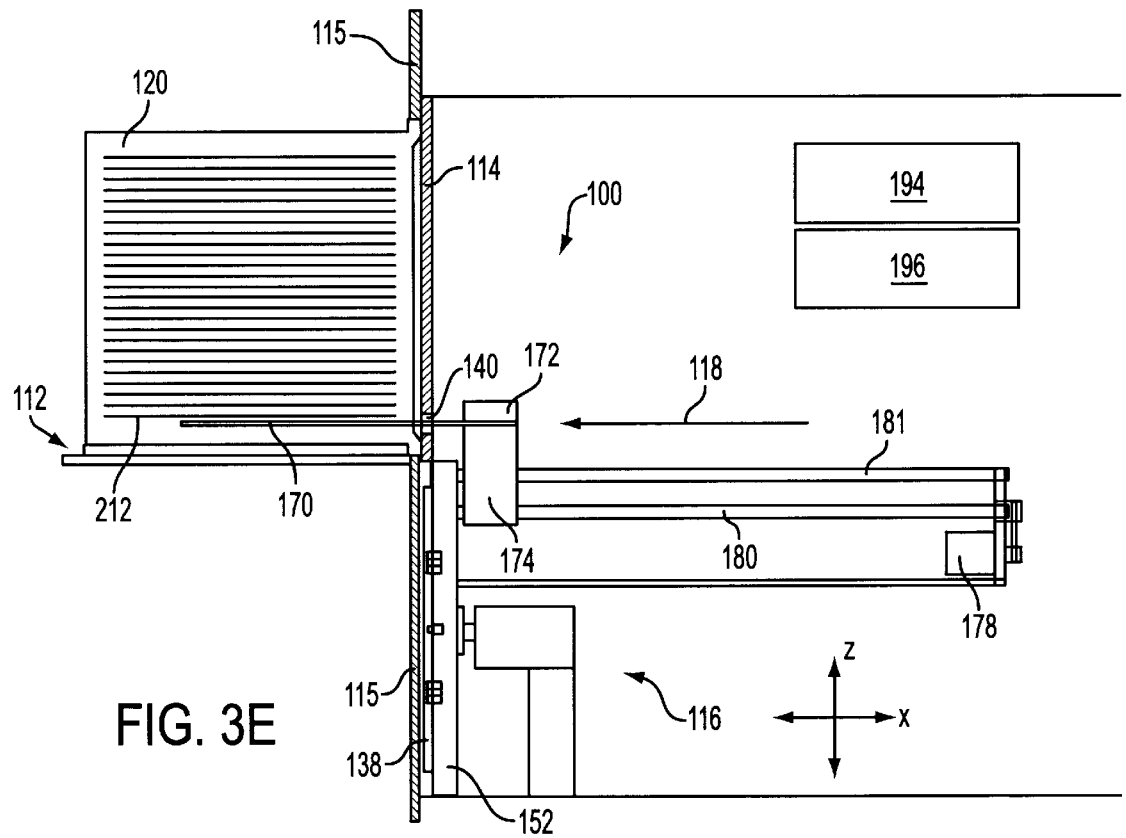
FIG. 3e is side elevational view of the mechanism of FIG. 2a in which an end effector has been moved into the pod.

FIG. 3e is a side elevational view of apparatus 100 in which the end effector 170 is moved through access opening 140. As shown by arrow 218, the end effector is moved along the x-axis into the pod 120. Preferably, the pod 120 has been positioned at a height such that the wafer 212 which is to be unloaded is just above the end effector, such as 1–2 mm. Thus, when the end effector 170 is moved as shown, it does not contact the wafer but moves just underneath it. Since the computer 134 knows the z-axis of end effector 170 (which is constant), the computer can position the pod and wafer to a predetermined position so that the end effector moves just underneath the desired wafer.

Figure 3F:
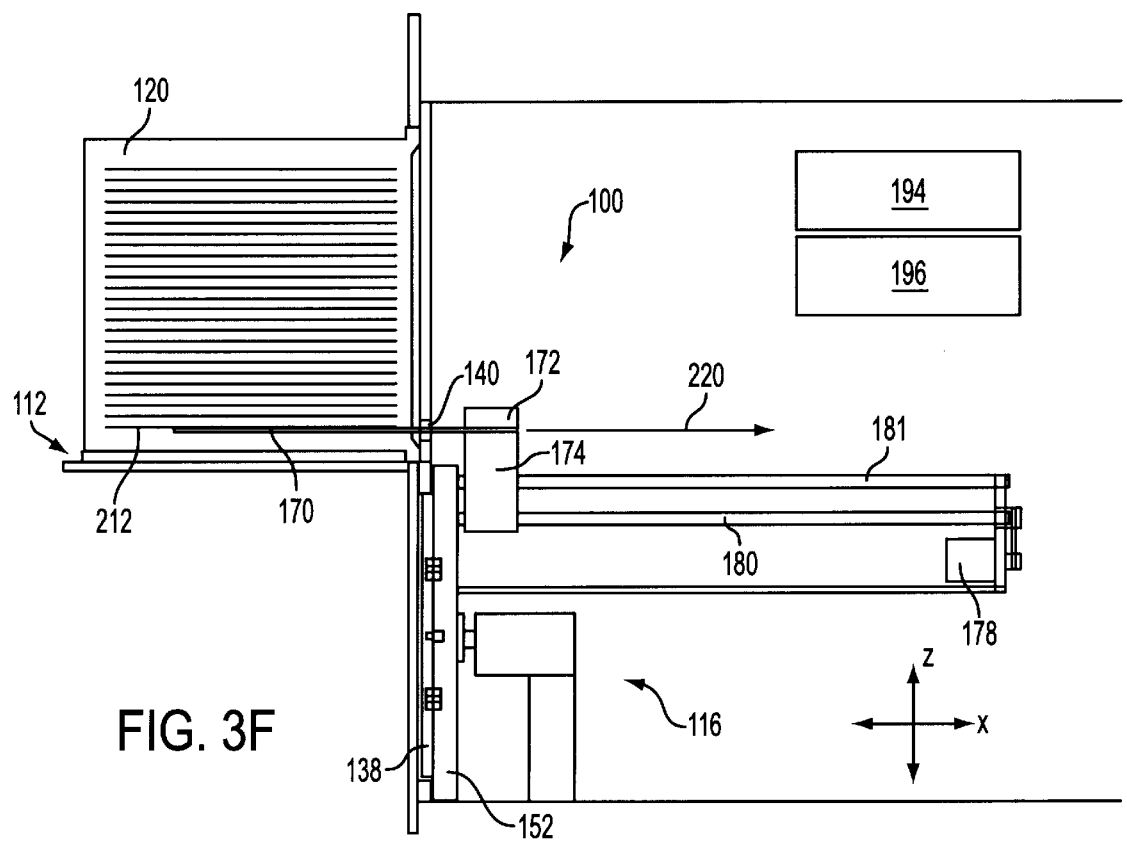
FIG. 3f is side elevational view of the mechanism of FIG. 2a in which a wafer has been lowered onto the end effector.

FIG. 3f is a side elevational view of apparatus 100 in which the end effector 170 unloads a wafer. Once the end effector is in the position shown in FIG. 3e, the pod 120 is lowered on the z-axis by a small amount to the position shown in FIG. 3f. As the pod 120 is lowered, the wafer 212 is left resting on the end effector. The computer then controls motor 178 to move the end effector out of the pod 120 holding the wafer 212 in the direction shown by arrow 220. The wafer 212 is preferably brought to a testing or processing station which may include, for example, a chuck or other platform that may elevate between prongs 173 and lift the wafer off the end effector 170 and allow the end effector to move away or perform tests with integrated testing devices. For example, one testing system is described in U.S. Pat. No. 5,479,108, issued Dec. 26, 1995, and hereby incorporated by reference herein. Other processing and testing mechanisms may also be used.

Loading a wafer from the end effector back into pod 120 is substantially the opposite procedure as that illustrated above. The end effector inserts the wafer into the pod, and the pod is moved along the z-axis to lift the wafer off the end effector. The end effector is then moved away from the pod and the pod is moved on the z-axis to align another wafer with the access opening 140 to allow another wafer to be unloaded and loaded. When no more wafers are to be tested or processed, the door 138 is placed back on the pod, the door is locked, and the plate 152 withdrawn to its contracted position as shown in FIG. 3d (or FIG. 3b if opening 136 need not be blocked). The pod is then removed from station 112.

Figure 4A:
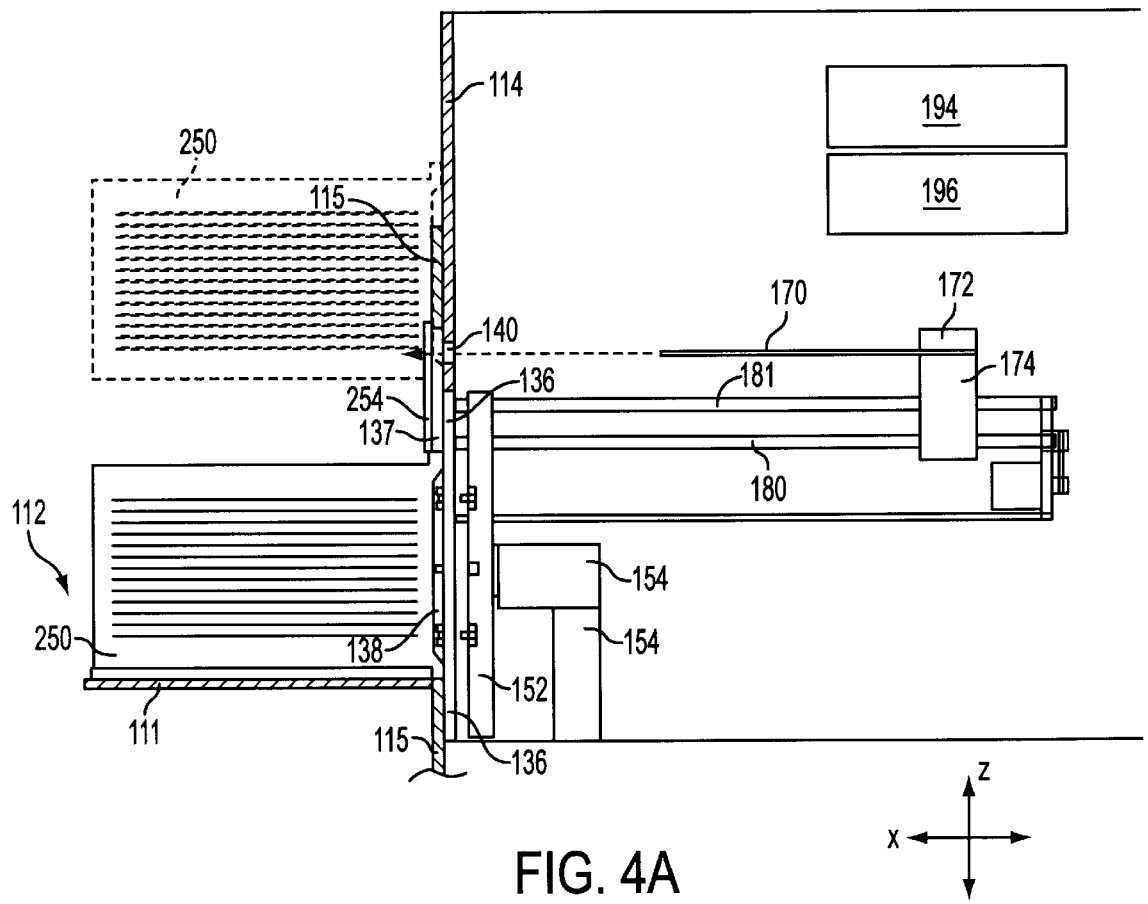
FIG. 4a is a side elevational view of the mechanism of FIG. 2a in which a smaller sized wafer pod is used.

FIG. 4a is a side elevation view of apparatus 100 of the present invention in which wafers are unloaded from a smaller pod. As in the above embodiments, a pod 250 is provided in holding station 112 and may be moved along the z-axis 126 by z-axis mechanism 124. Pod 250 is smaller than pod 120 of FIGS. 3a–3f; for example, while the pod 20 may hold 25 wafers, pod 250 may hold a maximum of 13 wafers.

The height of pod 250 and the door 252 of pod 250 are thus shorter than the height of door 138 and pod 120.

In the prior art load port devices, manual mechanical changes had to be made to the device if a different-sized pod was to be unloaded. In the present invention, no such extensive mechanical changes or replacements are required. A smaller-sized pod 250 need only be moved on the z-axis to be at the center of the main opening 136. For example, station 112, panel 115 and smaller-sized pod 250 are moved on the z-axis to a door opening position shown in FIG. 4*a*. The pins, latch receptacles, and other engagement devices on engagement plate 152 work the same on the smaller door 252 as on the larger door 38, since the receiving pins and latch keys are standardized to be at the same positions on the door.

Figure 4B:
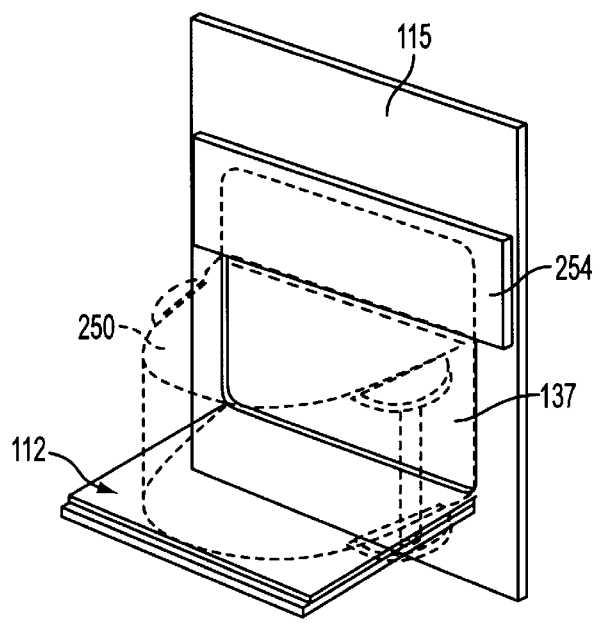

As shown in FIG. 4*b*, in most embodiments, to prevent the contamination of environment 150, spacer plate 254 can be placed over the upper portion of opening 137 which is not covered by the pod 250. The spacer plate 254 is secured in place to the moving panel 115 by fastener mechanisms such as pins that fit into sockets or other types of quick fasteners. The plate 254 can be kept secured to panel 115 as long as smaller size pods 250 are used. Thus, the upper portion of opening 136 is also covered by spacer plate 254 and contamination to the clean environment is minimized. The portion of opening 136 below the base 111 and pod 250 is covered by panel 115 which extends sufficiently below the base 111.

When one sized pod is removed and a different-sized pod is placed in station 12, then the space plate 254 is added or removed as appropriate. The plate 152 of the door removing mechanism can be positioned in the opening 136 of panel 14, which allows the blower 194 to provide positive air pressure inside the clean environment 150 and prevents any contaminants from entering the clean environment 150 when the pod is removed from station 112 and a new, different-sized or same sized pod is placed in station 112 for the testing process.

Referring again to FIG. 4*a*, once the door 252 of the pod 250 has been removed, the pod 250 (shown in dashed lines) is moved to the unloading/loading position. As in the embodiment of FIGS. 3*a*–3*f*, the end effector 170 is moved through access opening 140 in interface panel 114 to retrieve a desired wafer in the pod. This part of the unloading procedure is substantially the same as described in FIGS. 3*a*–3*f*.

In alternate embodiments, other types of wafer carriers, such as wafer cassettes, can be used in the present invention. For example, an open, unenclosed wafer cassette for 12-inch, 8-inch, or 6-inch wafers can be provided on station 12. No door need be removed from a wafer cassette, so only the wafer unloading/loading process need be performed. Although the cassette may provide additional leaks to the clean environment, the positive air pressure supplied by blower 94 preferably minimizes any contamination.

Figure 5:
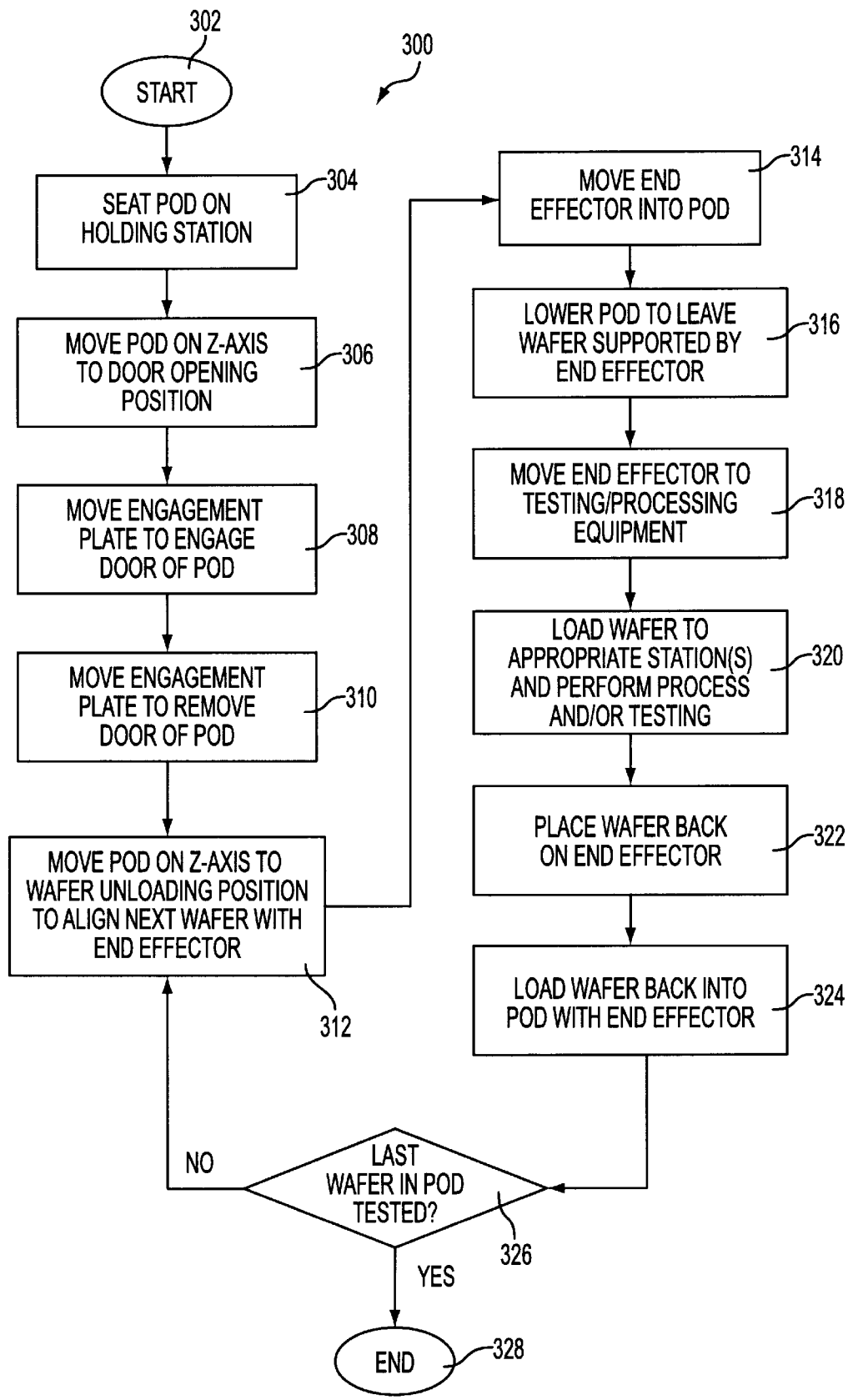
FIG. 5 is a flow diagram illustrating a method of the present invention for unloading and loading a wafer.

FIG. 5 is a flow chart illustrating a method of the present invention for unloading a wafer. The steps, in the preferred embodiment, are controlled by computer 134 using the motors of the apparatus 100, where the computer can follow program instructions or code to control the apparatus. Alternatively, some steps can be performed by manual or operator control. The process begins at 302, and in step 304, the pod 120 or 250 is seated on the holding station 112. As is well known to those skilled in the art, the pod 120 or 250 is preferably guided onto pins on the bottom surface of the station 112 and then push forward in slots until the front surface of the pod is flush with the end-effector side of the moving panel 115 though opening 137. The pod can include appropriate lips or seals or fit tightly enough to reduce or prevent contamination from the station side of the interface panel 114 from entering into the environment 150.

In step 306, the pod is moved on the z-axis using z-axis mechanism 124 to the door opening position. At this position, the main opening 136 is aligned with the opening 137 in the moving panel 115 and with the door 138 or 252 of the pod. In next step 308, the engagement plate 152 is moved to engage the door of the pod. Pins on plate 152 are mated to pins on the pod door, latch keys are rotated to unlock the door, and a vacuum pressure helps engage the plate to the door in some embodiments. In step 310, the engagement plate is retracted to remove the door from the pod. As noted above, the engagement plate need only have about 1 inch of range of movement to move the door far enough away from the pod to allow the pod to move on the z-axis. This is in contrast to the prior art devices which move the door at least three inches away from the pod and lower the door to make room for an end effector, which requires a more complex mechanism than the present invention.

In step 312, the pod is moved along the z-axis to the wafer unloading position so that the next wafer is aligned with the end effector, i.e., positioned just above the x-y plane of the end effector. The "next" wafer is the next wafer in the order of wafers in the pod that has not yet been tested/processed. If the door has just previously been removed, the next wafer is the first wafer, which, for example, can be the bottommost wafer in the pod. In next step 314, the end effector 170 is moved through access opening 140 in interface panel 114 and into the pod just underneath the desired wafer. In step 316, the pod is lowered along the z-axis 126 to leave the desired wafer supported by the end effector, i.e., the wafer is lifted off the walls of the slot in which the wafer is positioned so that the wafer is supported only by the end effector. In step 318, the end effector is moved to the testing and/or processing equipment in the environment 150, such as a testing chuck or processing chamber, and in step 320 the wafer is loaded at appropriate testing and/or processing stations and the testing and processing is performed. Such wafer testing and processing is well known to those skilled in the art. For example, a flat and center finder can determine physical dimensions of a wafer, and a four-point probe can be used to test the resistivity of the wafer.

In step 322, after the testing and/or processing is complete, the wafer is placed back on the end effector and in step 324, the wafer is loaded back into the pod using the end effector. The end effector moves along the x-axis, through access opening 40 and back into the pod, and the pod is moved along the z-axis to lift the wafer from the end effector using walls of the slot in which the wafer is positioned. The end effector is then moved out from the pod.

In step 326, it is checked whether the last wafer in the pod has been tested/processed. For example, the number of wafers in the pod can be entered into the computer by an operator, or a sensor such as a photodetector or similar device can be used to sense the wafers occupying the slots of the pod. If the last wafer has not been tested/processed, the process returns to step 312 to move the pod to align the next wafer with the end effector to remove the next wafer. If the last wafer has been tested/processed, then the process is complete at 328. The operator can remove the pod and load another one at station 12 if desired, as described in step 304.

While this invention has been described in terms of several preferred embodiments, it is contemplated that alterations, equivalents, and permutations thereof will become apparent to those skilled in the art upon a reading of the specification and study of the drawings. It is intended that the claims include all such alterations, equivalents, and permutations as fall within the spirit and scope of the present invention.

What is claimed is:

1. A wafer handling apparatus comprising:

a carrier station including a plate for supporting a wafer carrier including a pod having slots for holding a plurality of wafers, wherein said wafer carrier has a door removably coupled thereto via at least one lock;

a grounded panel supported by a ground surface and situated adjacently between said carrier station and at least one of a tester and a processor, said panel including an opening;

a z-movement mechanism coupled to said carrier station and operative to move said carrier station and said wafer carrier in a z-direction;

a door opening mechanism positioned to unlock and remove said door from said carrier through said opening in said panel; and a motor-driven handler mechanism including a wafer holding device, said wafer holding device operative to move into said wafer carrier at an aperture in said panel to load or unload a wafer between said wafer carrier and at least one of the tester and the processor.

2. A wafer handling apparatus as recited in claim 1 wherein said wafers are 300 mm in diameter.

3. A wafer handling apparatus as recited in claim 1 wherein said wafer holding device is a flat end effector for supporting a wafer.

4. A wafer handling apparatus as recited in claim 3 wherein said flat end effector includes a vacuum mechanism for providing a vacuum at said end effector to hold said wafer to said end effector.

5. A wafer handling apparatus as recited in claim 1 wherein said door opening mechanism includes a planar member that translates to engage said door and pull said door from said carrier through said opening.

6. A wafer handling apparatus as recited in claim 5 wherein said planar member moves within a distance of one inch.

7. A wafer handling apparatus as recited in claim 6 wherein said planar member includes a mechanism to engage a mechanism in said door.

8. A wafer handling apparatus as recited in claim 5 wherein said wafer holding device is constrained to move only in an x-y plane and not in said z-direction.

9. A wafer handling apparatus as recited in claim 5 wherein said wafer holding device is constrained to move only in an x-direction and not in said z-direction or a y-direction.

10. A wafer handling apparatus as recited in claim 1 further comprising a second panel coupled to said carrier station positioned parallel to said grounded panel and moveable in said z-direction, said second panel including an opening which is aligned with said opening in said grounded panel to allow said door of said carrier to be removed.

11. A wafer handling apparatus as recited in claim 10 wherein a gap between said second panel and said grounded panel is about 1 mm.

12. A wafer handling apparatus as recited in claim 1 wherein said wafer carrier positioned at said carrier station has one of multiple sizes, at least one size holding more wafers than another one of said sizes, and wherein said door removal mechanism may remove a door from a carrier of any of said sizes without changing said opening in said panel.

13. A wafer handling apparatus as recited in claim 12 wherein said sizes include one size holding a maximum of 13 wafers and another size holding a maximum of 25 wafers.

14. A wafer handling apparatus as recited in claim 12 wherein said opening is large enough to allow a door of said carrier that holds said greater number of wafers to move therethrough.

15. A wafer handling apparatus as recited in claim 14 further comprising plates coupled to said carrier station and provided over portions of said opening when said wafer carrier is of said smaller size.

16. A wafer loading and unloading apparatus comprising:

a carrier station including a plate for supporting a wafer carrier, said wafer carrier including a pod having slots for holding a plurality of wafers, wherein said wafer carrier has a door removably coupled thereto via at least one lock;

a grounded interface panel supported by a ground surface and including a main opening and an access opening positioned adjacent the main opening;

a z-movement mechanism coupled to said carrier station and operative to move said carrier station and said wafer carrier in a z-direction;

a door opening mechanism positioned to unlock and remove said door from said carrier through said main opening in said frame, wherein said door opening mechanism is constrained to move in an x-y plane and not in said z-direction; and a motor-driven handler mechanism including a wafer holding device, said wafer holding device operative to move into said wafer carrier through said access opening to load or unload a wafer between said carrier and at least one of a tester and a processor, wherein said wafer holding device includes a flat end effector for supporting a wafer, and wherein said handler mechanism moves said wafer.

17. A wafer loading and unloading apparatus as recited in claim 16 wherein said door opening mechanism includes a planar member operative to mate with said door and remove said door by moving away from said carrier in said x-y plane.

18. A wafer loading and unloading apparatus as recited in claim 16 wherein said door opening mechanism includes a planar member that translates to engage said door and pull said door from said carrier.

19. A wafer loading and unloading apparatus as recited in claim 16 wherein said planar member is constrained to move within a distance of one inch.

20. A wafer loading and unloading apparatus as recited in claim 16 wherein said end effector moves only along an x-axis and may not move along said y-axis or said z-axis.

21. A wafer loading and unloading apparatus as recited in claim 16 further comprising a controller operative to coordinate said z-movement mechanism, said door opening mechanism, and said handler mechanism, wherein said controller includes a digital computer.

22. A wafer loading and unloading apparatus as recited in claim 16 wherein said pod is enclosed for sealing said wafers from a surrounding environment.

23. A wafer loading and unloading apparatus as recited in claim 22 wherein said wafer carrier may be of one of two sizes, one size holding more wafers than the other size, wherein said main opening is large enough to allow a door of said carrier holding more wafers to pass therethrough, and wherein said door removal mechanism may remove a door from a carrier having either of said sizes without changing said opening in said panel.

24. An apparatus for loading or unloading a wafer, the apparatus comprising:

plate means for supporting a wafer carrier, said wafer carrier including a pod having slots for holding a plurality of wafers, wherein said wafer carrier has a door removably coupled thereto via at least one lock;

an interface panel supported by a ground surface and including a main opening and an access opening positioned adjacent to the main opening;

means for unlocking and moving said wafer carrier in a z-direction;

means for removing said door from said carrier through said main opening in said interface panel; and a motor-driven means for moving a wafer in to or out of said wafer carrier through said access opening.

* * * * *